(12) United States Patent
Ahmad et al.

(10) Patent No.: US 7,227,376 B2
(45) Date of Patent: Jun. 5, 2007

(54) DYNAMIC IMPEDANCE COMPENSATION CIRCUIT AND METHOD

(75) Inventors: Sagheer Ahmad, Sunnyvale, CA (US); Lin Chen, Cupertino, CA (US); Sam Huynh, Mountain View, CA (US); Shu-Shia Chow, Los Altos, CA (US); Joe Macri, San Francisco, CA (US)

(73) Assignee: ATI Technologies Inc., Markham, Ontario (CA)

( * ) Notice: Subject to any disclaimer, the term of this patent is extended or adjusted under 35 U.S.C. 154(b) by 44 days.

(21) Appl. No.: 10/982,485

(22) Filed: Nov. 5, 2004

(65) Prior Publication Data

US 2006/0097749 A1   May 11, 2006

(51) Int. Cl.
H03K 17/16       (2006.01)
H03K 19/003     (2006.01)
(52) U.S. Cl. .............................. 326/30; 326/34; 326/87
(58) Field of Classification Search ............ 326/26–27, 326/30–34, 87; 327/108–112
See application file for complete search history.

(56) References Cited

U.S. PATENT DOCUMENTS 6,400,546 B1   6/2002  Drapkin et al.
6,445,316 B1*  9/2002  Hsu et al. ................... 341/120
6,541,996 B1   4/2003  Rosefield et al.
2004/0044808 A1*  3/2004  Salmon et al. ................. 710/8

* cited by examiner

Primary Examiner—Anh Q. Tran
(74) Attorney, Agent, or Firm—Vedder, Price, Kaufman & Kammholz, P.C.

(57) ABSTRACT

An impedance compensation circuit generates per-group pull-up impedance information and per-group pull-down impedance information to calibrate a plurality of input/output pads and dynamically updates impedance information on a per channel basis. A group refers to a group of I/O pads having similar output drive strengths in a channel. A channel refers to all I/O pads, which collectively provide a bus interface to an external device. For example, all the I/O pads interfacing with a memory module may be grouped into a channel, and address I/O pads in a channel may be arranged into a "group." Memory I/O pads may be grouped together into a channel since memory interface pads have input/output characteristics that may be different from those of other types of I/O pads in the chip. According to one embodiment, per-group programmable offset information provides calibration information that may be different for each group in each channel.

28 Claims, 5 Drawing Sheets

DYNAMIC IMPEDANCE COMPENSATION CIRCUIT AND METHOD

FIELD OF THE INVENTION

The invention relates generally to impedance matching networks and more particularly to programmable on-chip impedance matching networks.

BACKGROUND OF THE INVENTION

Input/Output pads, also known as I/O buffers, are used in many integrated circuit applications. Conventional I/O pads typically include push/pull buffer configurations that include, for example, an output driver pull-up circuit and an output driver pull-down circuit. I/O pads are often connected to internal or external or off-chip pads on printed circuit boards or other integrated circuits. The I/O buffers are connected to other circuits through transmissions lines, such as printed circuit boards traces or any other suitable transmission lines. As is known in the art, transmission line signal distortions can result from impedance mismatches between the output buffer circuitry and the transmission line impedance. These signal distortions can vary due to fabrication process variations, temperature variations and other variations. Accordingly, I/O buffers have been designed to match the output impedance of the buffer with the transmission lines impedance. Without proper impedance matching, overshooting, undershooting and signal distortion can occur, particularly at high speeds. Further, an output pad may be required to drive multiple inputs. As a result, the drive strength of the output buffer requires adjustment accordingly.

Conventional solutions typically incorporate the use of off-chip components to implement matching termination networks. However, these can take up large amounts of space on the integrated circuit. Other, on-chip solutions require the use of separate test I/O pads for determining suitable impedance matching. For example, one external test pad is typically used to determine the suitable pull-up circuit impedance, whereas a separate additional test pad is used to determine suitable impedance matching for the pull-down circuit of the output buffer. In addition, separate external impedance calibration resistors are used for each I/O buffer section. The use of additional test pads and external resistors can impact board density, reliability and cost.

According to one embodiment, an on-chip impedance matching network provides a type of controlled impedance I/O pad by controlling a serially connected resistive element separate from the output drivers. For example, an array of programmable resistors in the form of parallel coupled transistors are controlled by on-chip calibration circuitry to program an on-chip impedance array by turning on and off various combinations of NFET transistors using an up/down counter. An external calibration resistor is connected to an internal chip pad. A differential amplifier is used to compare the internal pad voltage to a reference voltage. A difference between input voltages of the differential amplifier is perceived as a resistance mismatch between the external calibration resistor and the resistance of the transmissions line. The differential amplifier's output is programmed as an up/down counter to increase or decrease an output. The calibration is typically continuous. The method uses a separate programmable resistor array for each of a pull-down section and a pull-up section of an output buffer. However, this can unnecessarily increase the complexity and cost of the impedance matching circuit.

Other methods employ a plurality of external calibration resistors to duplicate the output buffer structure as the impedance compensation structure. Where two test pads and two external calibration resistors are used, the pull-up circuit, such as a P channel-based pull-up circuit, and an N channel output buffer pull-down circuit are typically independently tested and matched during normal operation of the chip. However, using dual calibration resistors can generate unnecessary internal noise. Known programmable impedance matching circuits effectively duplicate the structure of an I/O buffer, and the actual I/O buffer includes corresponding programmable resistor arrays that are then programmed to be identical to the impedance level determined through the I/O buffer impedance matching circuit. Typically, such I/O buffer impedance compensation circuits use, for example, an external pull-up calibration resistor that has an impedance equivalent to the line impedance to determine an appropriate impedance setting for the I/O pull-down circuit. Similarly, an external pull-down calibration resistor is coupled to ground and is used to determine a suitable impedance level for the pull-up circuit.

According to another method, an impedance compensation circuit for an I/O pad provides dynamic impedance compensation by using programmable impedance arrays and a dynamically adjustable on-chip load. Only a single off-chip calibration resistor is used, and only a single test pad is necessary. According to this method, all the I/O pads are calibrated to the same output drive strengths. However, memory interface pads, for example, typically require different output drive strength calibration for different groups in a channel. These interface pads, such as memory interface pads, may also require different drive strength calibration for different channels. As a result, all the I/O pads are calibrated with the same calibration setting, resulting in suboptimum calibration settings for some I/O pads.

According to another method, separate impedance controllers and impedance matching calibration circuits may be implemented for each of the different types of pads, such as memory pads. However, implementing separate impedance controller circuits and impedance matching calibration circuits would be an inefficient use of the limited number of transistors on an integrated circuit chip, and, further, would be expensive.

BRIEF DESCRIPTION OF THE DRAWINGS

The present invention is illustrated by way of example and not limitation in the accompanying figures, in which like referenced numerals indicate similar elements and in which.

DETAILED DESCRIPTION OF THE PREFERRED EMBODIMENTS

Figure 1:
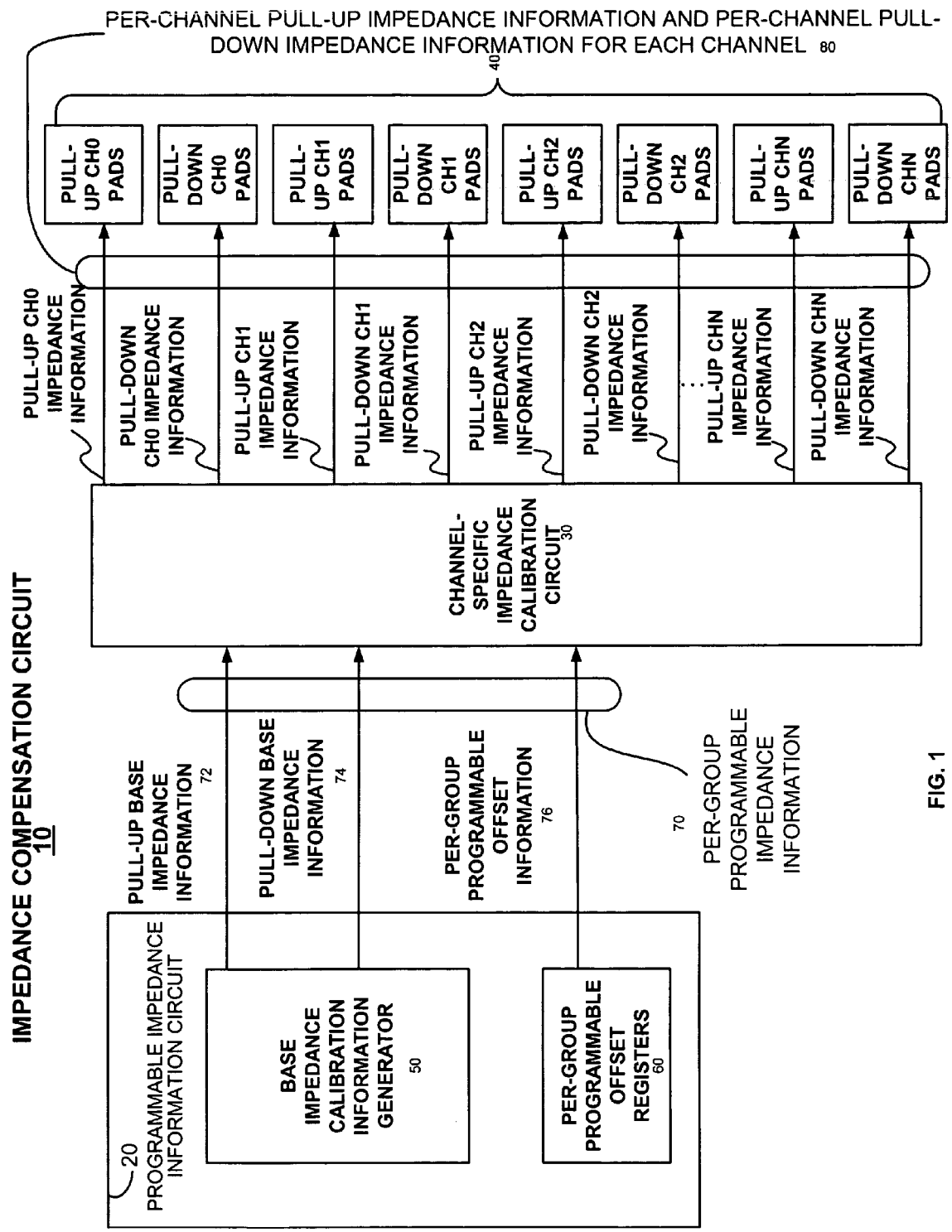
FIG. 1 is a block diagram of an impedance compensation circuit according to one embodiment of the invention.

An impedance compensation circuit generates per-group pull-up impedance information and per-group pull-down impedance information to calibrate a plurality of input/output pads and dynamically updates impedance information on a per channel basis. A group refers to a group of I/O pads having similar output drive strengths in a channel. A channel refers to all I/O pads, which collectively provide a bus interface to an external device. For example, all the I/O pads interfacing with a memory module may be grouped into a channel, and address I/O pads in a channel may be arranged into a "group." Memory I/O pads may be grouped together into a channel since memory interface pads have input/output characteristics that may be different from those of other types of I/O pads in the chip. According to one embodiment, per-group programmable offset information provides calibration information that may be different for each group in each channel.

Among other advantages, the impedance compensation circuit calibrates groups of pads where the different groups of pads may have different output drive strengths. Also, similar groups of different channels may have different drive strengths. Although the impedance compensation circuit calibrates the input/output pads based on groups of I/O pads that have different output drive strengths, only one impedance controller circuit and one impedance matching calibration circuit are required. As a result, separate impedance controller circuits and impedance matching calibration circuits for each group of each channel of pads are not required, thus saving space on an integrated circuit.

The impedance compensation circuit updates the per-channel pull-up impedance information and the per-channel pull-down impedance information in response to interactively and dynamically measuring pull-up strength feedback information and pull-down strength feedback information. In response, the impedance compensation circuit makes adjustments to further improve impedance calibration for the input/output pads of the integrated circuit. The impedance compensation circuit, therefore, may further improve impedance match calibration of the input/output pads, thereby increasing the processing speed of the integrated circuit. For example, if the operating speed of each channel of pads on the integrated circuit may be increased, then the result will be an increase in production yield of higher-performance components. Increasing the yield provides the added benefit of reducing costs, since more integrated circuits are produced at higher operating speeds.

The impedance matching calibration circuit may dynamically sense changing environmental conditions, such as temperature, and in response cause the impedance controller circuit to dynamically change the pull-up base impedance information and the pull-down base impedance information. As a result, the impedance compensation circuit may dynamically adjust to environmental conditions in order to provide the optimum operating speed required. Additionally, by dynamically adjusting the pull-up base impedance information and the pull-down base impedance information, the minimum configuration or number of output drivers required for each pad are enabled, thus requiring a minimum amount of power consumption. Further, since the impedance compensation circuit dynamically adjusts input/output pads on a per-channel basis in response to detecting changes in environmental conditions, the impedance compensation circuit of the present invention increases the operating frequency of the integrated circuit and further increases the operating frequency of a parallel or serial bus.

FIG. 1 illustrates a block diagram of an impedance compensation circuit 10 including a programmable impedance information circuit 20, a channel-specific impedance calibration circuit 30, a plurality of pull-up channel pads and a plurality of pull-down channel pads 40. Although pull-up channel pads 0, 1, 2 . . . N and pull-down channel pads 0, 1, 2 . . . N are shown, any number of pull-up channel pads and pull-down channel pads are contemplated. As previously stated, the pull-up pads and the pull-down pads include programmable matching arrays, such as a plurality of parallel coupled PMOS transistor fingers, an on-chip programmable pull-down impedance matching array, a plurality of NMOS parallel coupled transistor fingers, and a configurable on-chip impedance element, such as a plurality of parallel coupled PMOS transistors.

The channel-specific impedance calibration circuit 30 is operably coupled to both the plurality of pull-up channel pads and pull-down channel pads 40 and the programmable impedance information circuit 20. The programmable impedance information circuit 20 includes a base impedance calibration information generator 50 and per-group programmable offset registers 60. The channel-specific impedance calibration circuit 30, as used herein, includes discrete logic state machines or any other suitable combination of hardware/software and/or firmware. Further, the channel-specific impedance calibration circuit 30 may be one or more suitably programmed processors, such as a microprocessor, a microcontroller or a digital signal processor, and therefore includes associated memory that contains executed instructions that, when executed, cause the channel-specific impedance calibration circuit 30 to carry out the operations described herein.

The programmable impedance information circuit 20 may be one or more discrete logic state machines or any other suitable combination of hardware/software and/or firmware. Further, the programmable impedance information circuit 20 may be one or more suitably programmed processors, such as a microprocessor, a microcontroller or a digital signal processor, and therefore includes associated memory that contains executed instructions that, when executed, cause the programmable impedance information circuit 20 to carry out the operations described herein.

The per-group programmable offset registers 60 may be, for example, one or more registers, random access memory (RAM), read-only memory (ROM), optical memory or any suitable storage medium located locally on-chip or remotely off-chip, if desired. By way of example, the impedance compensation circuit 10 may be part of an integrated circuit on one or more semiconductor dies, such as an application-specific integrated circuit (ASIC). According to one embodiment, the integrated circuit is a video graphics circuit. The video circuitry may include memory, such as, but not limited to, dynamic random access memory (DRAM). This memory may reside on the same semiconductor die (ASIC) as the video graphics circuitry or it may be separate and connected through board-level or package-level traces. According to another embodiment, the integrated circuit is a memory circuit such as a dynamic RAM (DRAM) synchronous memory, such as synchronous dynamic RAM (SDRAM) or synchronous graphics RAM (SGRAM), ROM or any other suitable memory device.

The various elements of the impedance compensation circuit 10 are connected by a plurality of links. The links may be any suitable mechanisms for conveying electrical signals or data as appropriate. According to one embodiment, the interface between the channel-specific impedance calibration circuit 30, the pull-up and pull-down channel pads 40 and the programmable impedance information circuit 20 may be an integrated circuit interconnection within an application-specific integrated circuit (ASIC). Alternatively, one or more components may be off-chip so that the links may be a PCI bus, an AGP bus, a PCI-express bus, an I²C (IC bus) or any other suitable type of bus, either standardized or proprietary.

Figure 2:
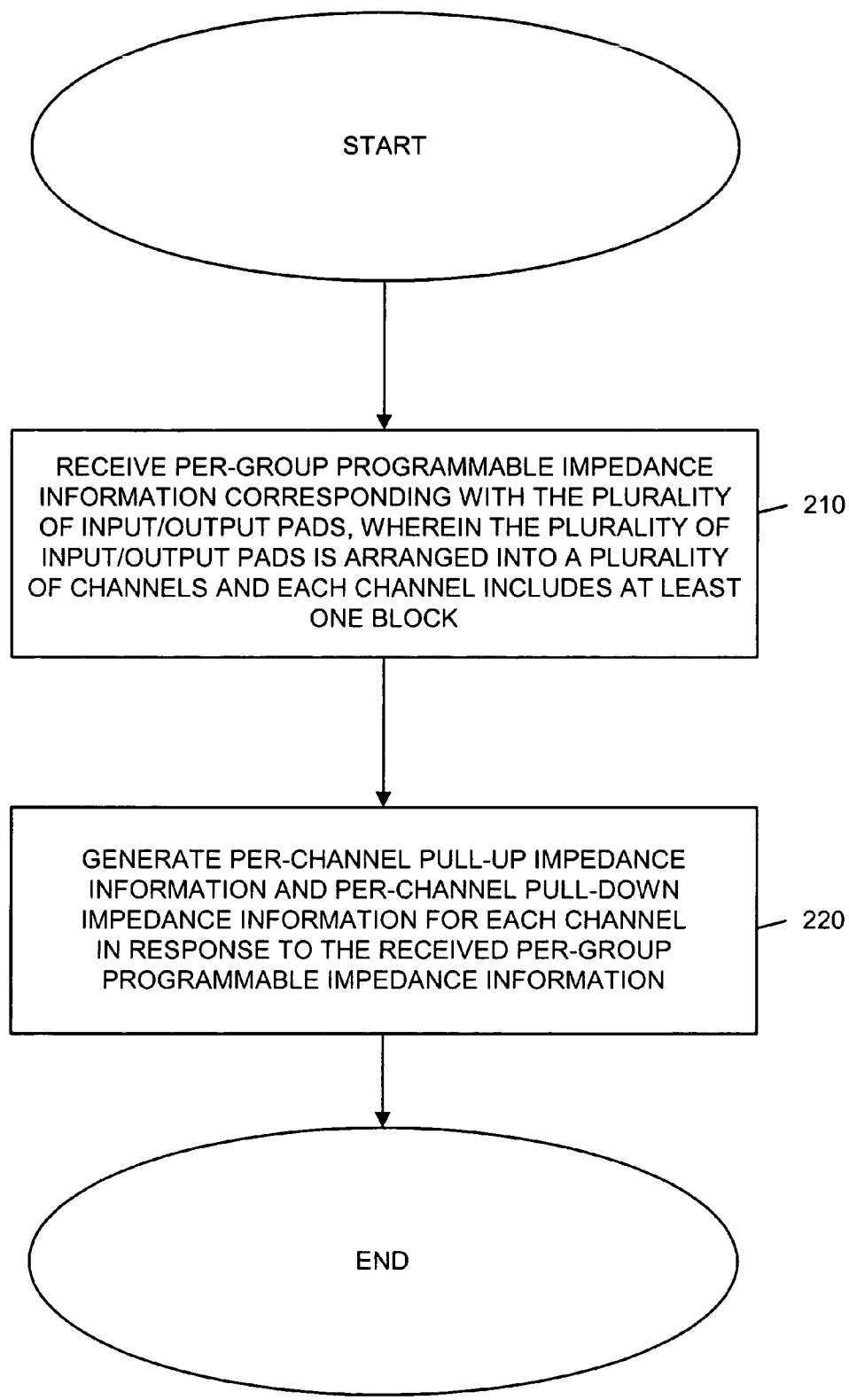
FIG. 2 is a method of impedance compensation for a plurality of input/output pads according to one embodiment of the invention.

FIG. 2 illustrates a flow chart for a method of impedance compensation for a plurality of input/output pads, such as the pull-up channel pads and pull-down channel pads 40. The method may be carried out by the impedance compensation circuit 10 including any combination of, for example, the channel-specific impedance calibration circuit 30 and the base impedance calibration information generator 50. However, any other suitable structure may also be used. It will be recognized that the method, beginning with step 210, will be described as a series of operations, but the operations may be performed in any suitable order and may be repeated in any suitable combination.

As shown in step 210, the programmable impedance information circuit 20 generates, among other things, base impedance calibration information. The programmable impedance information circuit 20 provides base calibration information and per-group programmable impedance information 70 corresponding with the plurality of pull-up channel pads and pull-down channel pads 40 and base calibration information. The per-group programmable impedance information 70 includes pull-up base impedance information 72, pull-down base impedance information 74 and per-group programmable offset information 76.

As shown in step 220, the channel-specific impedance calibration circuit 30 receives the per-group programmable impedance information 70 and in response generates per-channel pull-up impedance information and per-channel pull-down impedance information for each channel 80. As previously stated, although four sets of pull-up and pull-down channels are shown in FIG. 1, any number of channels, and therefore any corresponding number of pull-up channel impedance information and pull-down channel impedance information, are contemplated.

According to one embodiment, one or more of the plurality of pull-up channel pads and pull-down channel pads 40 may be memory interface pads. For example, the memory interface pads may be divided into a number of channels, where each channel is associated with a bus-interface to a distinct memory module. As a result, each of the channel pads, such as the memory interface pads and the nonmemory interface pads, can be calibrated differently. According to one embodiment, the plurality of pull-up and pull-down pads in a channel having similar output drive strengths are associated with a corresponding group. The per-group programmable impedance information 70 may account for differences in impedance between different groups of different channels.

According to one embodiment, the channel-specific impedance calibration circuit 30 receives the per-group programmable impedance information 70 in response to an impedance change in pull-up base impedance information 72, pull-down base impedance information 74, or change in the per-group programmable offset registers. The updated per-group programmable impedance information 70 dynamically changes the per-channel pull-up impedance information and the per-channel pull-down impedance information 80. For example, the base impedance calibration information generator 50 may dynamically change the pull-up base impedance information 72 and the pull-down base impedance information 74 in response to a detected impedance change in a calibration pad, as is known in the art.

Figure 3:
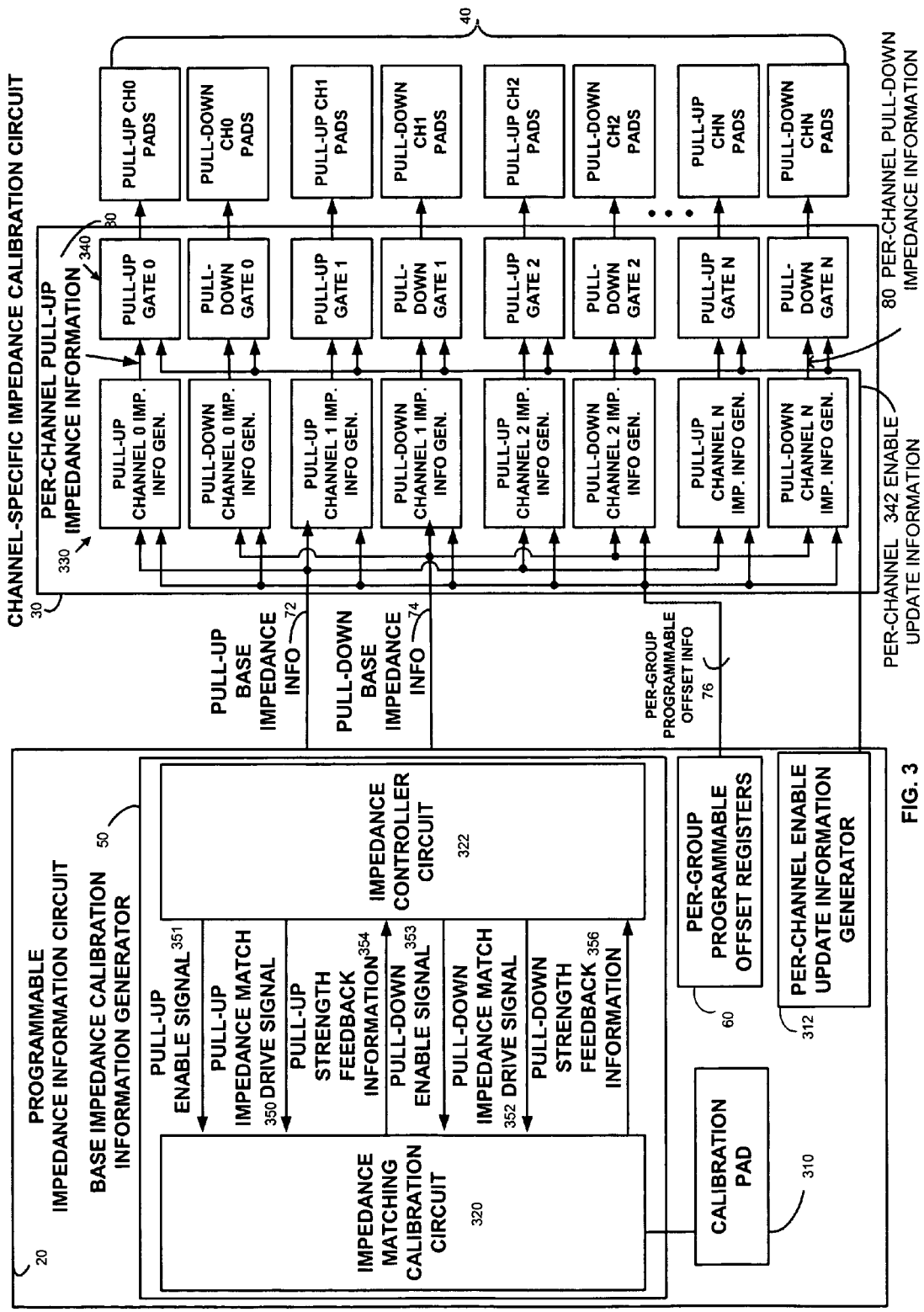
FIG. 3 is a block diagram illustrating the impedance compensation circuit according to another embodiment of the invention.

FIG. 3 illustrates a block diagram of the impedance compensation circuit 10 according to another embodiment of the present invention. The programmable impedance information circuit 20 further includes a calibration pad 310 and a per-channel enable update information generator 312. The base impedance calibration information generator 50 further includes an impedance matching calibration circuit 320 and an impedance controlled circuit 322. The channel specific impedance calibration circuit 30 includes a plurality of pull-up channel impedance information generators and pull-down channel impedance information generators 330 and corresponding pull-up gates and pull-down gates 340 as previously stated. Although four channels are shown in FIG. 3, any number of channels may be used.

The per-channel enable update information generator 312 generates per-channel enable update information 342 in response to detecting, for example, a bus idle signal. For example, a bus idle signal may be detected in response to the inactivity of an I/O buffer or a bus, such as an accelerated graphics processor (AGP) bus's idle. This may be generated from, for example, a memory-controller when the memory controller detects no client-requests for a memory channel, or when a memory client issues a refresh request to that memory channel. As will be discussed further below, the per-channel enable update information 342 will enable the plurality of pull-up and pull-down gates 340 to latch or hold the per-channel pull-up impedance information and per-channel pull-down impedance information 80 in order to suitably enable or disable the plurality of transistor fingers in each of the output drivers of the buffers within the pull-up channel pads and pull-down channel pads 40.

Figure 4:
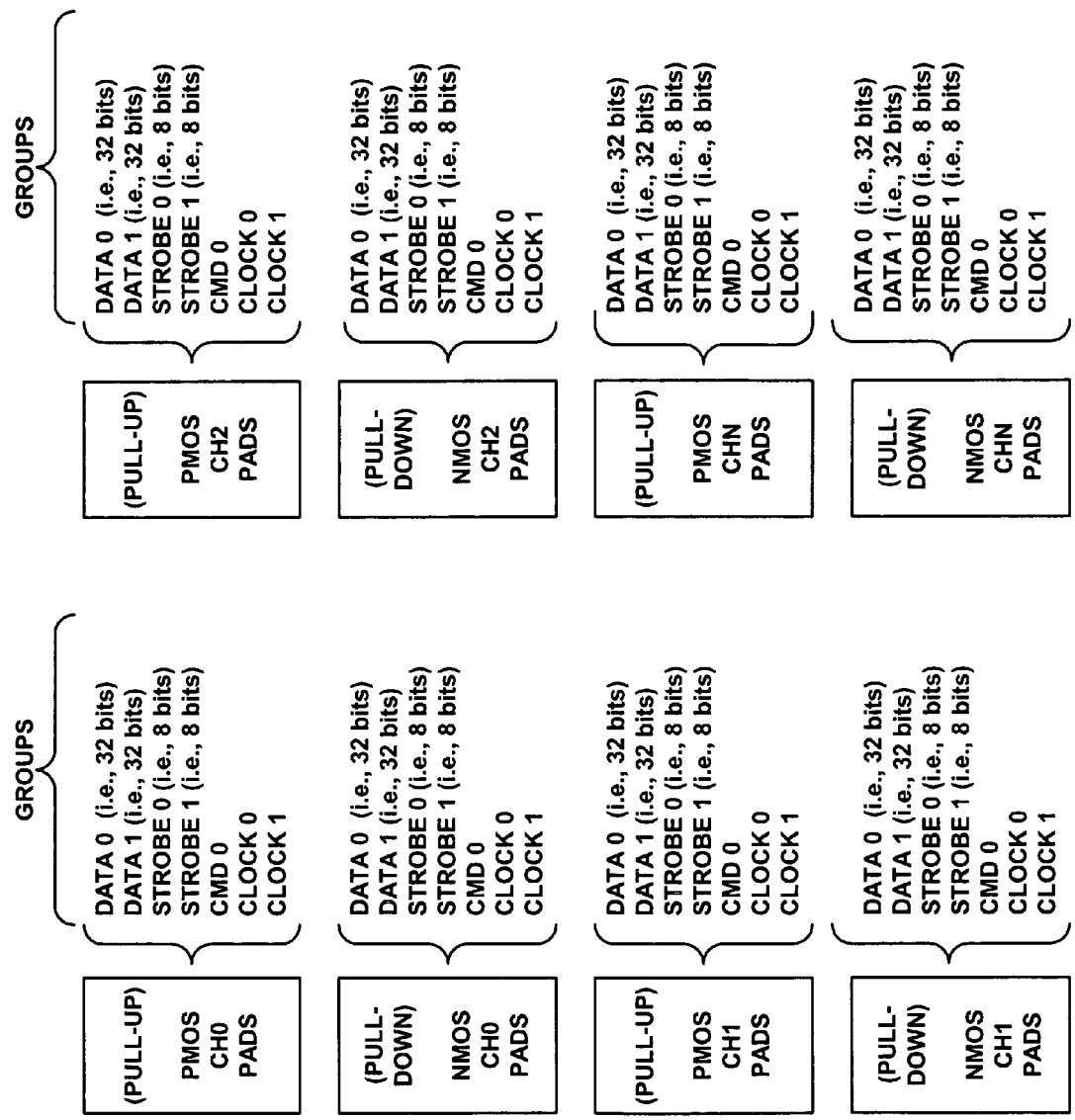
FIG. 4 diagrammatically illustrates the groupings of pads associated with both pull-up and pull-down pads in each channel according to another embodiment of the invention.

FIG. 4 diagrammatically illustrates the groupings of pads associated with both of the pull-up channel pads and pull-down channel pads 40 according to one embodiment. For example, the groupings of pads associated with the pull-up channel pads and pull-down channel pads 40 may be located on a video graphics integrated circuit, a memory device integrated circuit, a central processing unit integrated circuit, an I/O bridge integrated circuit or any suitable integrated circuit. As shown in FIG. 4, each of the channels may be grouped into 7 different groups, where pads in a group have similar output drive strength. For example, a typical memory (DRAM) interface has data, strobe, address/command, and clocks pads that may each be associated with a channel. The groups include data0, 32 bits of data pads, strobe0, strobes associated with data0, data1, 32 bits of data pads, strobe1, strobes associated with data1, command, address & command pads, clock0 and clock1 pads. Therefore, the impedance compensation circuit 10 provides the advantage of adapting to environmental conditions such as temperature changes as determined by the base impedance calibration information generator 50 and may also compensate for differences between output drive strengths of the various input/output pads as programmed in the per-group programmable offset registers 60.

Figure 5:
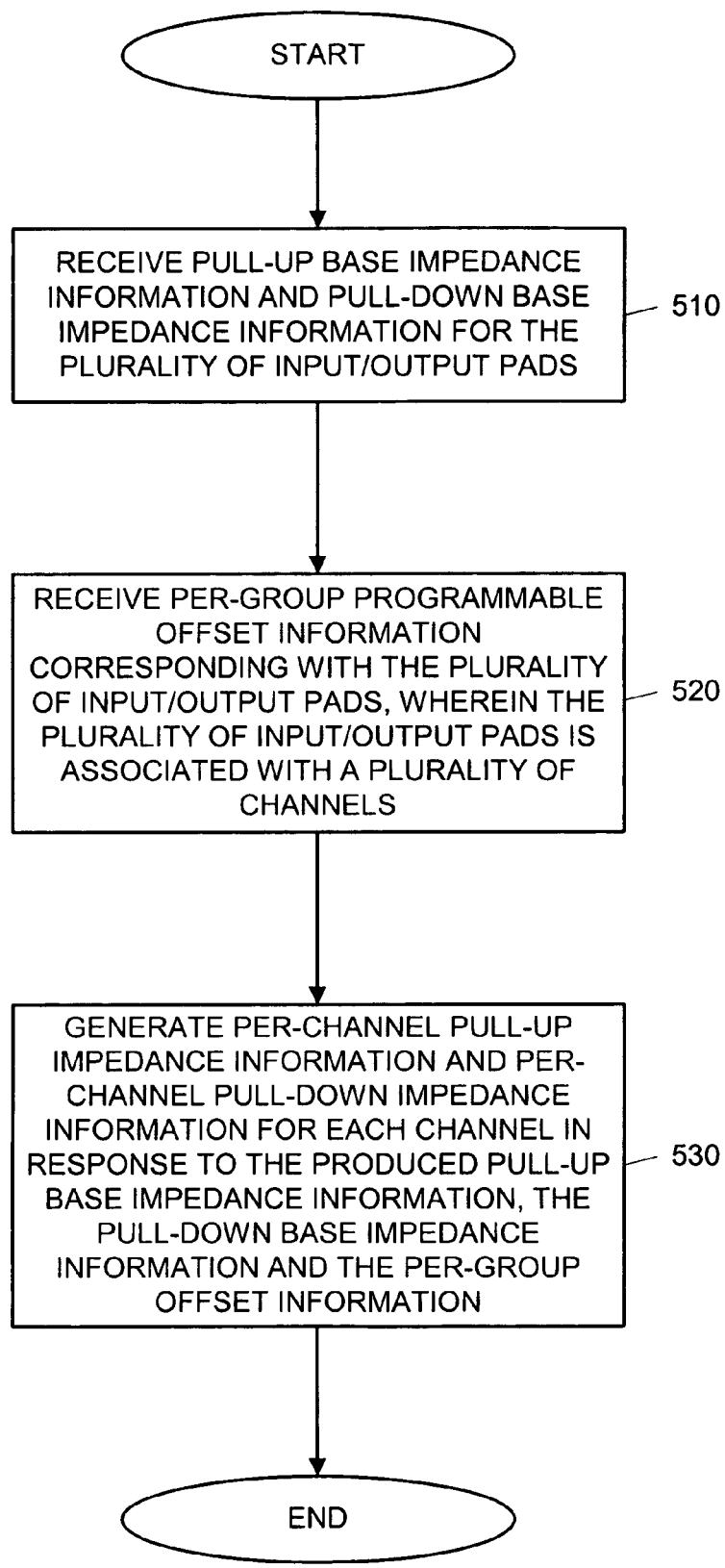
FIG. 5 is a flowchart illustrating a method of impedance compensation for the plurality of pull-up channel pads and the pull-down channel pads according to another embodiment of the invention.

FIG. 5 illustrates a method of impedance compensation for a plurality of input/output pads, according to another embodiment of the present invention. The method may be carried out by the impedance compensation circuit 10 with respect to FIGS. 1 and 3 and specifically with the channel specific impedance calibration circuit 30. However, any other suitable structure may also be used. It will be recognized that the method, beginning with step 510, will be described as a series of operations, but the operations may be performed in any suitable order and may be repeated in any suitable combination.

As shown in step 510, the channel-specific impedance calibration circuit 30 receives the pull-up base impedance information 72 and the pull-down base impedance information 74 for the plurality of pull-up channel pads and the pull-down channel pads 40.

As shown in step 520, the channel-specific impedance calibration circuit 30 receives per-group programmable offset information 76 corresponding with the plurality of pull-up channel pads and the pull-down channel pads 40. The plurality of pull-up channel pads and pull-down channel pads 40 are associated with a plurality of channels, as previously described. According to one embodiment, the per-group programmable offset registers 60 provide the per-group programmable offset information 76 to the channel-specific impedance calibration circuit 30. For example, the per-group programmable offset information 76 may be determined based on experimental results. Experiments may be conducted to determine the output drive strengths of the different channels of input/output pads. As a result, the relative differences between the input/output pad channels may be programmed into the per-group programmable offset registers 60 as per-group programmable offset information 76. As a result, the plurality of pull-up channel pads and the pull-down channel pads 40 may have different calibration settings in order to accommodate differences in impedance loading and current loading. For a given printed circuit such as a suitable graphics processor the per-group programmable offset information 76 may be determined using a suitable software application or driver to compensate for process and voltage variation. The software or driver can exhaustively search through all the offset values for a group of I/O pads, to determine the per-group programmable offset information 76, which gives maximum frequency of operation for those pads. Dynamic calibration provides the impedance compensation for temperature and other environmental variations during operation.

As shown in step 530, the plurality of pull-up channel impedance information generators and pull-down channel impedance information generators 330 add the pull-up base impedance information 72 and the pull-down base impedance information 74, respectively, with the corresponding per-group programmable offset information 76 to produce the per-channel pull-up impedance information and the per-channel pull-down impedance information 80. Therefore, according to one embodiment, the pull-up channel impedance information generators and the pull-down channel impedance information generators 330 each represent a digital adder or any other suitable circuit.

The impedance matching calibration circuit 320 receives at least a pull-up impedance match drive signal 350, a pull-up enable signal 351, a pull-down impedance match drive signal 352, and a pull-down enable signal 353 and, in response, generates pull-up strength feedback information 354 and pull-down strength feedback information 356. The impedance controller circuit 322 receives the pull-up strength feedback information 354 and the pull-down strength feedback information 356 and in response generates the pull-up base impedance information 72 and the pull-down base impedance information 74 for the plurality of pull-up channel pads and pull-down channel pads 40. Further, the impedance controller circuit 322 generates the pull-up impedance match drive signal 350 and the pull-down impedance match drive signal 352.

According to one embodiment, in response to receiving the pull-up base impedance information 72 and the pull-down base impedance information 74, from the impedance controller circuit 322, the impedance controller circuit 322 is operative to provide an updated pull-up impedance match drive signal 350 and an updated pull-down impedance match drive signal 352 to the impedance matching calibration circuit 320. As is known in the art, the impedance controller circuit 322 continues to monitor the impedance match of the calibration pad 310 in response to the pull-up base impedance information 72 and the pull-down base impedance information 74. According to one embodiment, the impedance controller circuit 322 sends and holds the pull-down impedance match drive signal 352 and the pull-up impedance match drive signal 350 to the impedance matching calibration circuit 320 and waits to receive the pull-down strength feedback information 356 and the pull-up strength feedback information 354 before yet again changing the pull-up impedance match drive signal 350 and the pull-down impedance match drive signal 352. This minimizes the probability of a glitch and otherwise helps smooth out and provide a steady and stable operation within the feedback loop.

Among other advantages, the impedance compensation circuit 10 calibrates channels of I/O pads where the different channels of pads may have different output drive strengths. Although the impedance compensation circuit 10 calibrates the plurality of I/O pads 40 based on groups of pads that have different output drive strengths, only one impedance controller circuit 322 and one impedance matching calibration circuit 320 are required. As a result, separate impedance controller circuits 322 and impedance matching calibration circuits 320 for each group of each channel of pads are not required, thus saving space on an integrated circuit.

The impedance compensation circuit 10 may update the per-channel pull-up impedance information and the per-channel pull-down impedance information 80 in response to interactively and dynamically measuring pull-up strength feedback information 354 and pull-down strength feedback information 356. In response, the impedance compensation circuit 10 makes adjustments to further improve impedance calibration for the plurality of input/output pads 40 of the integrated circuit. The impedance compensation circuit 10, therefore, may further improve impedance match calibration of the plurality of input/output pads 40, thereby increasing the processing speed of the integrated circuit. For example, if the operating speed of each channel of pads on the integrated circuit may be increased, then the result will be an increase in production yield of higher-performance components. Increasing the yield provides the added benefit of reducing costs, since more integrated circuits are produced at higher operating speeds.

The impedance matching calibration circuit 320 may dynamically sense changing environmental conditions, such as temperature, and in response cause the impedance controller circuit 322 to dynamically change the pull-up base impedance information 72 and the pull-down base impedance information 74. As a result, the impedance compensation circuit 10 may dynamically adjust to environmental conditions in order to provide the optimum operating speed required. Additionally, by dynamically adjusting the pull-up base impedance information 72 and the pull-down base impedance information 74, the minimum configuration or number of output drivers required for each pad are enabled, thus requiring a minimum amount of power consumption. Further, since the impedance compensation circuit 10 dynamically adjusts input/output pads on a per-channel basis in response to detecting changes in environmental conditions, the impedance compensation circuit 10 of the present invention increases the operating frequency of the integrated circuit and further increases the operating frequency of a parallel or serial bus.

It is understood that the implementation of other variations and modifications of the present invention and its various aspects will be apparent to those of ordinary skill in the art and that the invention is not limited by the specific embodiments described herein. It is therefore contemplated to cover by the present invention any and all modifications, variations or equivalents that fall within the spirit and scope of the basic underlying principles disclosed and claimed herein.

The invention claimed is:

1. An impedance compensation circuit for a plurality of input/output pads comprising:
    a programmable impedance information circuit operative to generate per-group programmable impedance information corresponding with the plurality of input/output pads, wherein the plurality of input/output pads are associated with a plurality of channels; and
    a channel-specific impedance calibration circuit, operatively coupled to the programmable impedance information circuit, a plurality of pull-up channel pads and a plurality of pull-down channel pads, and operative to receive the per-group programmable impedance information, and in response to generate per-channel pull-up impedance information and per-channel pull-down impedance information for each channel.

2. The impedance compensation circuit of claim 1 wherein the input/output pads having similar output drive strengths are associated with a corresponding group of a channel.

3. The impedance compensation circuit of claim 1 wherein the channel specific impedance calibration circuit is operative to receive the per-group programmable impedance information corresponding with an impedance change in at least one of the input/output pads, and in response dynamically change at least one of the per-channel pull-up impedance information and the per-channel pull-down impedance information in response to the received per-group programmable impedance information.

4. The impedance compensation circuit of claim 1 wherein the channel-specific impedance calibration circuit dynamically changes at least one of: the per-channel pull-up impedance information and the per-channel pull-down impedance information during at least one of: a memory idle mode and a memory refresh mode.

5. An impedance compensation circuit for a plurality of pull-up channel pads and a plurality of pull-down channel pads comprising:
    a base impedance calibration information generator operative to produce pull-up base impedance information and pull-down base impedance information for the plurality of pull-up channel pads and the plurality of pull-down channel pads;
    a plurality of per-group programmable offset registers operative to produce per-group programmable offset information; and
    a channel-specific impedance calibration circuit, operatively coupled to the base impedance information generator, the plurality of per-group programmable offset registers, the plurality of pull-up channel pads and the plurality of pull-down channel pads, and operative to receive the pull-up base impedance information, the pull-down base impedance information and the per-group programmable offset information, and in response to produce per-channel pull-up impedance information and per-channel pull-down impedance information, wherein the plurality of pull-up channel pads and the plurality of pull-down channel pads are associated with a plurality of channels.

6. The impedance compensation circuit of claim 5 wherein the channel-specific impedance calibration circuit is operative to add the pull-up base impedance information and the pull-down base impedance information with the corresponding per-group programmable offset information, to produce the per-channel pull-up impedance information and the per-channel pull-down impedance information.

7. The impedance compensation circuit of claim 5 wherein the input/output pads having similar output drive strengths are associated with a corresponding group of a channel.

8. The impedance compensation circuit of claim 5 wherein the base impedance information generator dynamically changes the pull-up base impedance information and the pull-down base impedance information in response to an impedance change in at least one of the pull-up channel pads and the pull-down channel pads.

9. The impedance compensation circuit of claim 5 wherein the base impedance calibration information generator dynamically changes the per-channel pull-up impedance information and the per-channel pull-down impedance information during at least one of: a memory idle mode and a memory refresh mode.

10. An impedance compensation circuit for a plurality of input/output pads comprising:
    an impedance matching calibration circuit operative to receive at least a pull-up impedance match drive signal and a pull-down impedance match drive signal, and in response generate pull-up strength feedback information and pull-down strength feedback information;
    an impedance controller circuit, operatively coupled to the impedance matching calibration circuit and operative to receive the pull-up strength feedback information and the pull-down strength feedback information, and in response generate pull-up base impedance information and pull-down base impedance information for the plurality of input/output pads, and operative to generate the pull-up impedance match drive signal and the pull-down impedance match drive signal;
    a plurality of per-group programmable offset registers operative to generate per-group programmable offset information; and
    a channel-specific impedance calibration circuit, operatively coupled to the impedance controller circuit, the plurality of per-group programmable offset registers, a plurality of pull-up channel pads and a plurality of pull-down channel pads, and operative to receive the pull-up base impedance information, the pull-down base impedance information and the per-group programmable offset information, and in response to generate per-channel pull-up impedance information and per-channel pull-down impedance information, wherein the plurality of pull-up channel pads and the plurality of pull-down channel pads are associated with a plurality of channels.

11. The impedance compensation circuit of claim 10 wherein in response to the impedance controller circuit being operative to generate the pull-up base impedance information and the pull-down base impedance information, the impedance controller is operative to provide an updated pull-up impedance match drive signal and an updated pull-down impedance match drive signal to the impedance matching calibration circuit.

12. A method of impedance compensation for a plurality of input/output pads comprising:
   receiving per-group programmable impedance information corresponding with the plurality of input/output pads, wherein the plurality of input/output pads are associated with a plurality of channels; and
   generating per-channel pull-up impedance information and per-channel pull-down impedance information for each channel in response to the received per-group programmable impedance information.

13. The method of claim 12 wherein the input/output pads having similar output drive strengths are associated with a corresponding group of a channel.

14. The method of claim 12 including dynamically changing at least one of: the per-channel pull-up impedance information and the per-channel pull-down impedance information in response to an impedance change associated with the per-group programmable impedance information.

15. The method of claim 12 including dynamically changing at least one of the per-channel pull-up impedance information and the per-channel pull-down impedance information during at least one of: a memory idle mode and a memory refresh mode.

16. A method of impedance compensation for a plurality of pull-up channel pads and a plurality of pull-down channel pads comprising:
   receiving pull-up base impedance information and pull-down base impedance information for the plurality of pull-up channel pads and the plurality of pull-down channel pads;
   receiving per-group programmable offset information corresponding with the plurality of pull-up channel pads and the plurality of pull-down channel pads, wherein the plurality of pull-up channel pads and the plurality of pull-down channel pads are associated with a plurality of groups of a channel; and
   generating per-channel pull-up impedance information and per-channel pull-down impedance information for each channel in response to the produced pull-up base impedance information, the pull-down base impedance information and the per-group offset information.

17. The method of claim 16 including:
   adding the pull-up base impedance information and the per-group programmable offset information to produce the per-channel pull-up impedance information; and
   adding the pull-down base impedance information and the per-group programmable offset information to produce the per-channel pull-down information.

18. The method of claim 16 wherein the pull-up channel pads and the pull-down channel pads having similar output drive strengths are associated with a corresponding group of a channel.

19. The method of claim 16 including:
   dynamically changing the pull-up base impedance information and the pull-down base impedance information in response to an impedance change associated with at least one of: the pull-up base impedance information and the pull-down base impedance information.

20. The method of claim 16 including:
   dynamically changing the per-channel pull-up impedance information and the per-channel pull-down impedance information during at least one of: a memory idle mode and a memory refresh mode.

21. Memory containing instructions executable by one or more processing devices that cause the one or more processing devices to:
   receive per-group programmable impedance information corresponding with a plurality of input/output pads, wherein the plurality of input/output pads are associated with a plurality of groups of a channel; and
   produce per-channel pull-up impedance information and per-channel pull-down impedance information for each channel.

22. The memory of claim 21 containing executable instructions that causes the one or more processing devices to:
   dynamically change at least one of: the per-channel pull-up impedance information and the per-channel pull-down impedance information in response to an impedance change associated with at least one of the pull-up base impedance information and the pull-down base impedance information.

23. A graphics processing integrated circuit comprising:
   an impedance compensation circuit for a plurality of input/output pads comprising:
      a programmable impedance information circuit operative to generate per-group programmable impedance information corresponding with the plurality of input/output pads, wherein the plurality of input/output pads are associated with a plurality of channels;
      a channel-specific impedance calibration circuit, operatively coupled to the programmable impedance information circuit, a plurality of pull-up channel pads and a plurality of pull-down channel pads, and operative to receive the per-group programmable impedance information, and in response to generate per-channel pull-up impedance information and per-channel pull-down impedance information for each channel; and
   a graphics processor operatively coupled to the plurality of input/output pads.

24. The graphics processing integrated circuit of claim 23 wherein the input/output pads having similar output drive strengths are associated with a corresponding group of a channel.

25. A memory circuit comprising:
   an impedance compensation circuit for a plurality of input/output pads comprising:
      a programmable impedance information circuit operative to generate per-group programmable impedance information corresponding with the plurality of input/output pads, wherein the plurality of input/output pads are associated with a plurality of channels;
      a channel-specific impedance calibration circuit, operatively coupled to the programmable impedance information circuit, a plurality of pull-up channel pads and a plurality of pull-down channel pads, and operative to receive the per-group programmable impedance information, and in response to generate per-channel pull-up impedance information and per-channel pull-down impedance information for each channel; and
   memory operatively coupled to the plurality of input/output pads.

26. The memory circuit of claim 25 wherein the input/output pads having similar output drive strengths are associated with a corresponding group of a channel.

27. The programmable impedance information circuit of claim 1 wherein the per-group programmable impedance information comprises pull-up base impedance information, pull-down base impedance information and per-group programmable offset information.

28. The programmable impedance information circuit of claim 1 wherein the plurality of input/output pads are associated with a plurality of channels based on a common calibration setting for a plurality of groups wherein at least two groups of input/output pads have different drive strengths.

* * * * *